United States Patent
Kazama et al.

(10) Patent No.: US 8,633,724 B2
(45) Date of Patent: Jan. 21, 2014

(54) PROBE-UNIT BASE MEMBER AND PROBE UNIT

(75) Inventors: Toshio Kazama, Nagano (JP); Kohei Hironaka, Nagano (JP); Mitsuhiro Kondo, Nagano (JP); Osamu Ito, Nagano (JP)

(73) Assignee: NHK Spring Co., Ltd., Yokohama-shi (JP)

(*) Notice: Subject to any disclaimer, the term of this patent is extended or adjusted under 35 U.S.C. 154(b) by 330 days.

(21) Appl. No.: 13/130,920

(22) PCT Filed: Nov. 26, 2009

(86) PCT No.: PCT/JP2009/069954
§ 371 (c)(1),
(2), (4) Date: May 24, 2011

(87) PCT Pub. No.: WO2010/061888
PCT Pub. Date: Jun. 3, 2010

(65) Prior Publication Data
US 2011/0227596 A1   Sep. 22, 2011

(30) Foreign Application Priority Data

Nov. 26, 2008 (JP) ................. 2008-301223

(51) Int. Cl.
*G01R 31/00* (2006.01)
*G01R 1/073* (2006.01)
(52) U.S. Cl.
CPC .................. *G01R 1/07378* (2013.01)
USPC ............ 324/756.04; 324/756.03; 324/756.05
(58) Field of Classification Search
None
See application file for complete search history.

(56) References Cited

U.S. PATENT DOCUMENTS

| | | | | |
|---|---|---|---|---|
| 5,631,574 A | * | 5/1997 | Kazama | 324/754.14 |
| 6,018,249 A | | 1/2000 | Akram et al. | |
| 6,433,562 B1 | * | 8/2002 | McAllister et al. | 324/755.02 |
| 7,053,635 B2 | * | 5/2006 | Kazama et al. | 324/756.05 |
| 7,714,597 B2 | * | 5/2010 | Kazama | 324/756.01 |
| 8,087,955 B2 | | 1/2012 | Kazama et al. | |

(Continued)

FOREIGN PATENT DOCUMENTS

| | | |
|---|---|---|
| CN | 1646923 A | 7/2005 |
| CN | 101300495 A | 11/2008 |

(Continued)

OTHER PUBLICATIONS

International Search Report for PCT/JP2009/069954 issued Dec. 28, 2009.

(Continued)

*Primary Examiner* — Paresh Patel
(74) *Attorney, Agent, or Firm* — Edwards Wildman Palmer LLP (57) ABSTRACT

A probe-unit base member having high rigidity and requiring no troublesome operations for its manufacture and a probe unit are provided. To achieve the purpose, the probe-unit base member includes a conductive substrate 41 that has a first opening 41*a* capable of fitting therein a probe holder 3 and a second opening 41*b* communicated with the first opening 41*a*; a coating 42 that is made of an insulating adhesive agent and is coated at least on an edge of the second opening 41*b*; and an insulating guide member 43 that is bonded to the edge of the second opening 41*b* through the coating 42 and guides one of two contact bodies to a position in contact with probes 2.

7 Claims, 4 Drawing Sheets

(56) References Cited

U.S. PATENT DOCUMENTS

| | | |
|---|---|---|
| 8,087,956 B2 | 1/2012 | Nakayama |
| 2004/0124862 A1 | 7/2004 | Sugawara |
| 2005/0225313 A1 | 10/2005 | Kazama et al. |
| 2009/0183908 A1 | 7/2009 | Kazama et al. |
| 2010/0041251 A1 | 2/2010 | Nakayama |

FOREIGN PATENT DOCUMENTS

| | | |
|---|---|---|
| JP | 63-307369 | 12/1988 |
| JP | 10-178129 A | 6/1998 |
| JP | 3671567 B2 | 6/1998 |
| JP | 2000-068017 | 3/2000 |
| JP | 2001-526395 | 12/2001 |
| KR | 20080063530 A | 7/2008 |
| TW | 200700736 A | 1/2007 |
| TW | 200728725 A | 8/2007 |
| WO | WO-99/30174 A1 | 6/1999 |
| WO | WO-03/087852 | 10/2003 |
| WO | WO 2007/052557 | 5/2007 |

OTHER PUBLICATIONS

Office Action dated Feb. 18, 2013, issued for the corresponding Chinese patent application No. 200980146252.2 and English translation thereof.

Office Action dated May 6, 2013, issued for the corresponding Taiwanese Patent Application No. 098140287.

\* cited by examiner

FIG.4

PROBE-UNIT BASE MEMBER AND PROBE UNIT

CROSS REFERENCE TO RELATED APPLICATIONS

This is the national stage of International App. No. PCT/JP2009/069954, filed Nov. 26, 2009, which application claims priority to Japanese Pat. App. No. 2008-301223, filed Nov. 26, 2008, both of which applications are incorporated herein by reference.

FIELD

The present invention relates to a probe-unit base member provided in a probe unit, which includes a conductive probe having both ends respectively brought into contact with two different contact bodies and a probe holder for housing a plurality of the probes, and that secures and holds the probe holder, and relates to the probe unit provided with the probe-unit base member.

BACKGROUND

When electrical characteristics of a test object such as a semiconductor package are to be tested, to establish electrical conduction between the test object and a tester for generating a testing signal, there is used a probe unit provided with a plurality of conductive probes and an insulating probe holder that houses and holds the probes corresponding to a wiring pattern of the test object.

Conventionally, as a technology for the probe unit, there is known a technology for fixing a frame-shaped base member, in which metal with high strength such as aluminum or stainless steel is used as a base material and an insulating layer is provided over a substantially entire surface of the base material, to a probe holder for reinforcement (see, e.g., Patent Literature 1). In this technology, an insulating frame-shaped guide member may be screwed to an opening of the base member in order to perform accurate alignment between a semiconductor package and the probe holder.

CITATION LIST

Patent Literature

Patent Literature 1: International Publication Pamphlet No. 03/087852

SUMMARY

Technical Problem

The conventional technology is required to secure a certain amount of thickness for a portion of the guide member through which a screw is inserted. Therefore, for example, when the size of the probe unit cannot be changed, the thickness of the portion where the screw is screwed to the base member has to be made thinner by the thickness of the portion for insertion of the screw which is secured in the guide member, thus resulting in reduction of rigidity of the base member.

In addition, the conventional technology has some problem in that the base member and the guide member have to be screwed and this causes troublesome operations when the probe unit is manufactured.

The present invention has been made in view of the above, and an object of the present invention is to provide a probe-unit base member which has high rigidity and does not require troublesome operations for its manufacture, and also provide a probe unit.

Solution to Problem

To solve the problem described above and achieve the object, according to the present invention, there is provided a probe-unit base member provided in a probe unit, which includes a conductive probe having both ends respectively brought into contact with two different contact bodies and a probe holder for housing a plurality of the probes arranged in a predetermined pattern while the both ends of each of the probes are exposed, the probe-unit base member securing and holding the probe holder, the probe-unit base member including: a conductive substrate that has a first opening capable of fitting therein the probe holder and a second opening communicated with the first opening; a coating that is made of a material including an insulating adhesive agent and is coated at least on an edge of the second opening; and an insulating guide member that is bonded to the edge of the second opening through the coating and guides one of the two contact bodies to a position in contact with the probes.

In the probe-unit base member according to the present invention as set forth in the invention described above, the guide member is made of a material having an antistatic property higher than that of the insulating adhesive agent.

In the probe-unit base member according to the present invention as set forth in the invention described above, an opening area of the second opening is larger than that of the first opening, and a stepped surface between the first opening and the second opening is cut along a boundary between the first opening and the second opening.

In the probe-unit base member according to the present invention as set forth in the invention described above, the substrate is exposed on the stepped surface.

According to the present invention, there is provided a probe unit including: a conductive probe having both ends respectively brought into contact with two different contact bodies; a probe holder for housing a plurality of the probes arranged in a predetermined pattern while the both ends of each of the probes are exposed; and a probe-unit base member that includes a conductive substrate that has a first opening capable of fitting therein the probe holder and a second opening communicated with the first opening, a coating that is made of a material including an insulating adhesive agent and is coated at least on an edge of the second opening, and an insulating guide member that is bonded to the edge of the second opening through the coating and guides one of the two contact bodies to a position in contact with the probes, wherein the probe-unit base member secures and holds the probe holder.

In the probe unit according to the present invention as set forth in the invention described above, the probe-unit base member includes an inlet for flowing air therein from outside of the probe-unit base member, and the probe holder includes a flow passage that is communicated with the inlet and allows the air flowed therein through the inlet to flow.

In the probe unit according to the present invention as set forth in the invention described above, the probe holder includes a holder portion that is made of an insulating material and holds the probes; and a frame portion that is made of a conductive material and includes a hollow portion capable of fitting therein the holder portion.

Advantageous Effects of Invention

According to the present invention, it includes the conductive substrate that includes the first opening capable of fitting therein the probe holder, and the second opening whose bottom is located on the same plane as the bottom of the first opening and which is communicated with the first opening in such a manner that the portion overlapping the bottom of the first opening is open; the insulating coating that is made of the insulating adhesive agent and is coated at least on the edge of the second opening; and the insulating guide member that is bonded to the edge of the second opening through the coating and guides one of the two contact bodies to the position in contact with the probe. Therefore, there is no need to screw the guide member to the substrate. Consequently, the thickness for insertion of the screw does not need to be secured in the guide member, and the thickness of the portion of the substrate to which the guide member is bonded can thereby be increased accordingly, thus improving rigidity of the probe-unit base member. Moreover, because there is no need to screw the guide member to the substrate, it is possible to reduce troublesome operations upon manufacture.

DESCRIPTION OF EMBODIMENTS

An exemplary embodiment (hereinafter, called "embodiment") to implement the present invention will be explained below with reference to the attached drawings. It should be noted that the drawings are schematic, and thus a relation between a thickness and a width of each portion and a ratio between thicknesses of respective portions may be different from those in real ones. It goes without saying that a different portion in a relation and a ratio between mutual dimensions may be included in the drawings.

Figure 1:
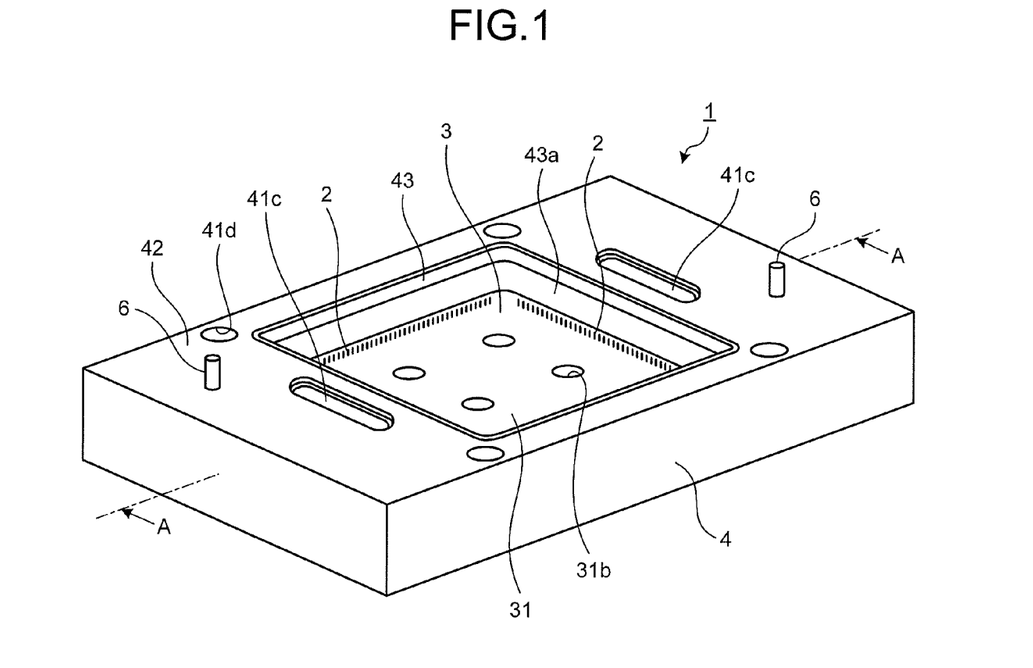
FIG. 1 is a perspective view illustrating a structure of a probe unit according to an embodiment of the present invention.
Figure 2:
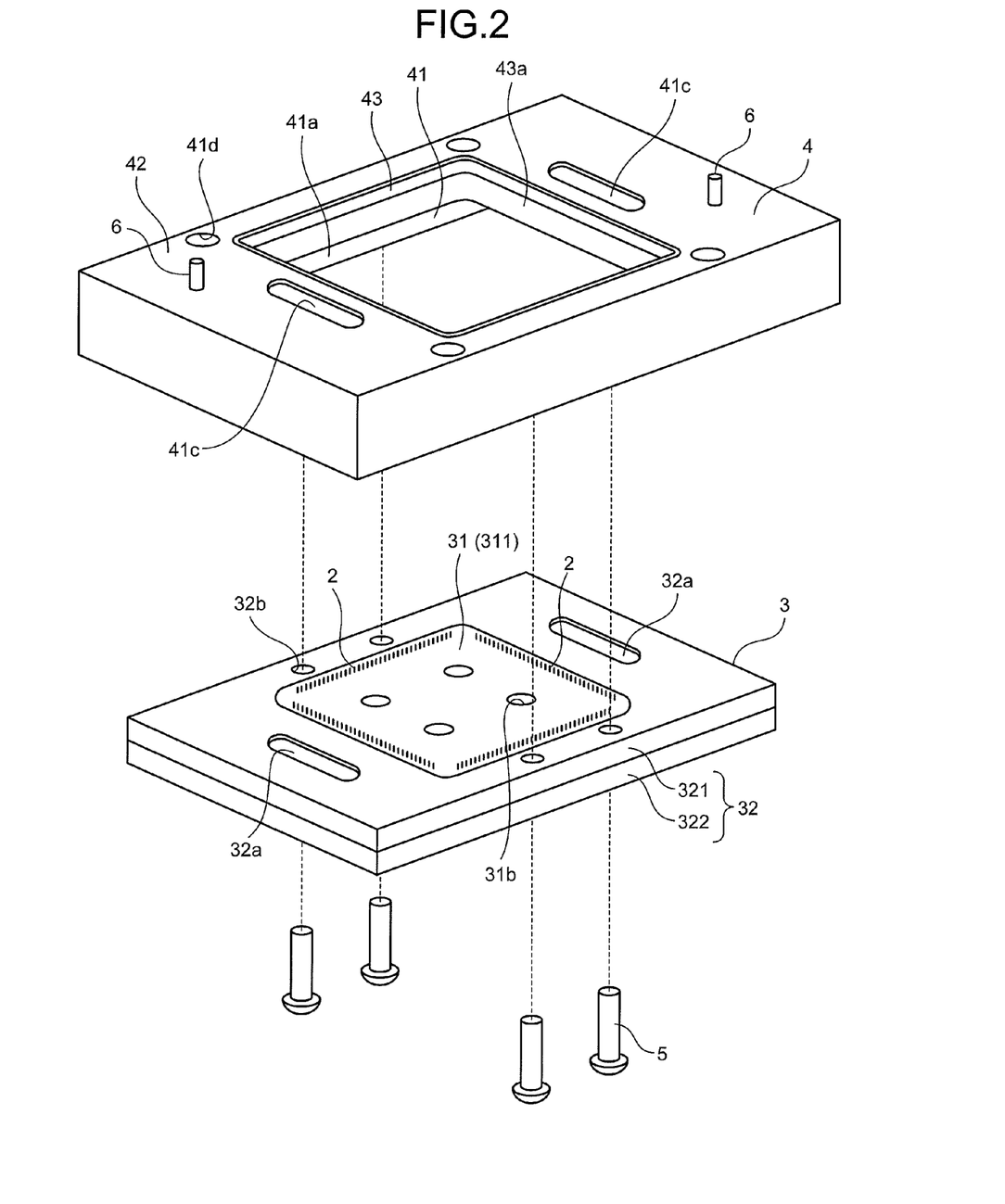
FIG. 2 is an exploded perspective view illustrating the structure of the probe unit according to the embodiment of the present invention.
Figure 3:
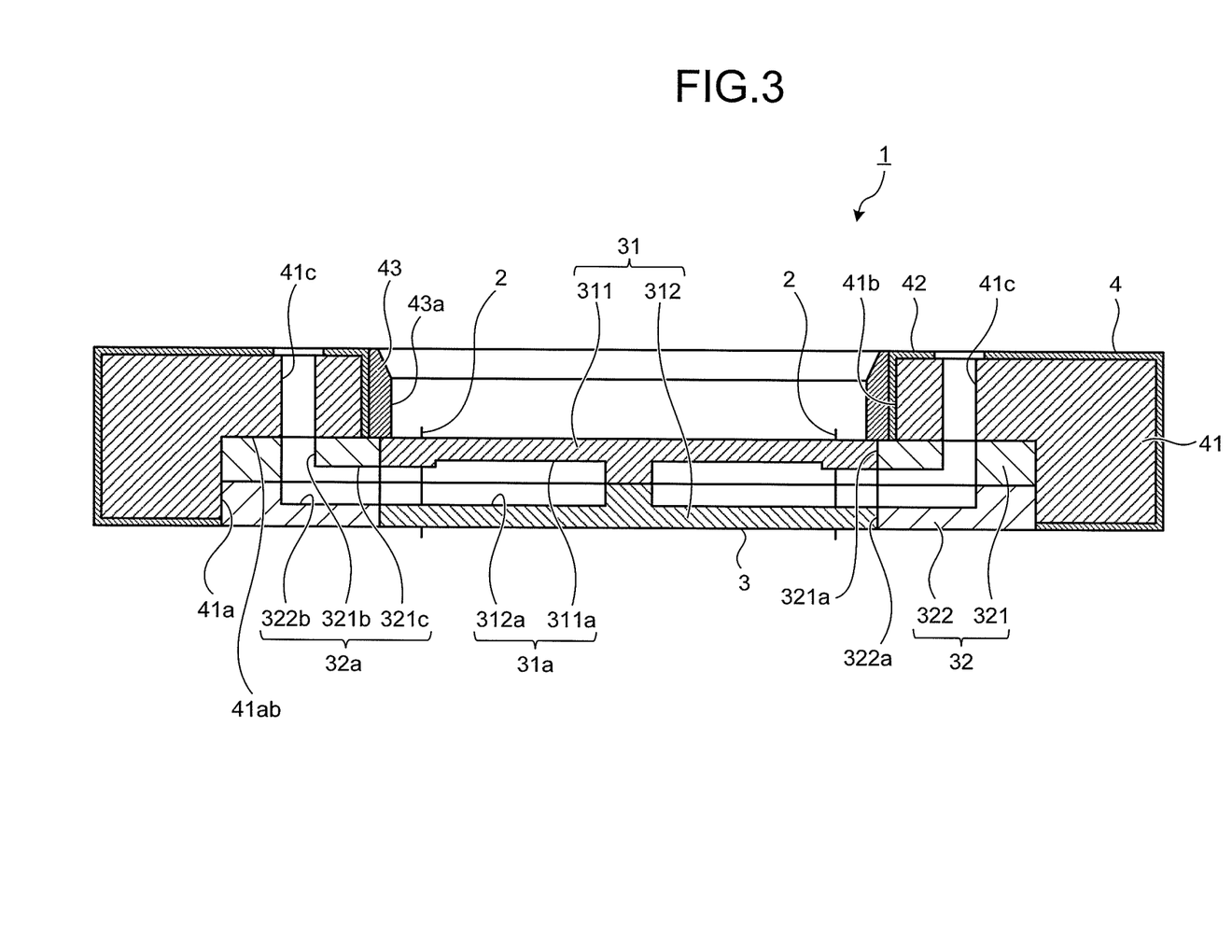
FIG. 3 is an A-A line cross-sectional view of FIG. 1.

FIG. 1 is a perspective view illustrating a structure of a probe unit according to an embodiment of the present invention. FIG. 2 is an exploded perspective view illustrating the structure of the probe unit according to the present embodiment. FIG. 3 is an A-A line cross-sectional view of FIG. 1. A probe unit 1 illustrated in FIG. 1 to FIG. 3 is a device for electrically connecting between two different contact bodies, or between a semiconductor package being a test target and a wiring substrate on a tester side for outputting a testing signal to the semiconductor package. The probe unit 1 includes a plurality of conductive probes 2, a probe holder 3 for housing the probes 2 according to a wiring pattern of the semiconductor package, and a probe-unit base member 4 (hereinafter, "base member 4") for securing and holding the probe holder 3.

A detailed structure of the probe unit 1 will be explained below. First, the structure of the probe 2 is explained with reference to FIG. 4. The probe 2 includes a first plunger 21 in contact with an electrode 101 of a semiconductor package 100; a second plunger 22 that is formed from the same material as that of the first plunger 21, protrudes toward a direction opposite to the first plunger 21, and is in contact with an electrode 201 of a wiring substrate 200; and a spring member 23 that is provided in between the first plunger 21 and the second plunger 22 to connect the first plunger 21 and the second plunger 22 and that is extensible in its longitudinal direction. The probe 2 is formed with a conductive material such as iron.

Figure 4:
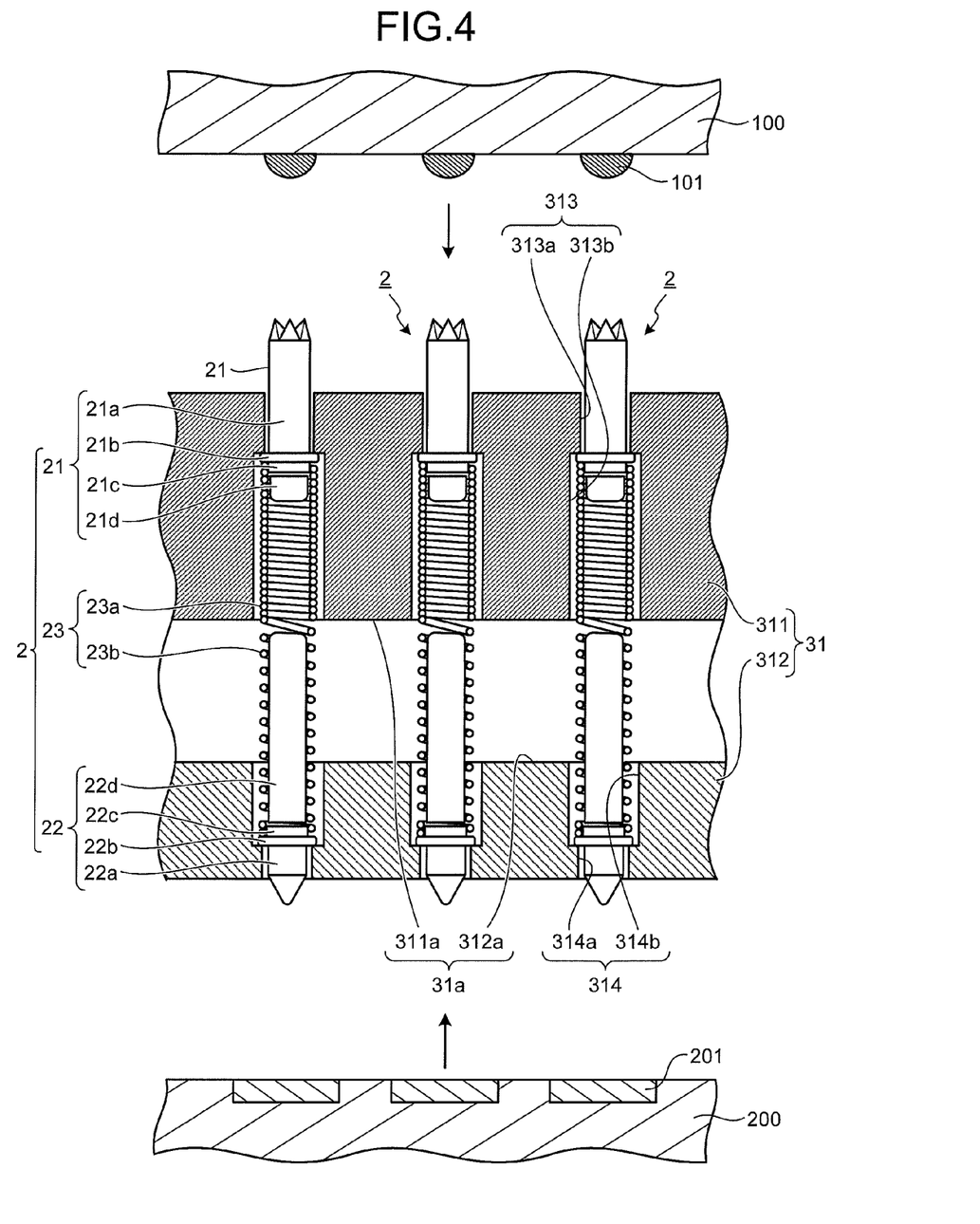
FIG. 4 is a partial cross-sectional view illustrating a main portion of probes and a probe holder.

The first plunger 21 includes a crown-shaped end portion 21a; a flange portion 21b having a larger diameter than the diameter of the end portion 21a; a boss portion 21c that protrudes in the direction opposite to the end portion 21a from the flange portion 21b and has a cylindrical shape having a diameter smaller than the diameter of the flange portion 21b and slightly larger than the internal diameter of the spring member 23, and over which the end portion of the spring member 23 is press-fitted; and a base end portion 21d that has a cylindrical shape having a diameter smaller than the diameter of the boss portion 21c and smaller than the internal diameter of the spring member 23. The first plunger 21 has the shape axially symmetric with respect to an axis parallel to the longitudinal direction.

The second plunger 22 includes a sharp-pointed end portion 22a; a flange portion 22b having a larger diameter than the diameter of the end portion 22a; a boss portion 22c that protrudes in the direction opposite to the end portion 22a from the flange portion 22b and has a cylindrical shape having a diameter smaller than the diameter of the flange portion 22b and slightly larger than the internal diameter of the spring member 23, and over which the end portion of the spring member 23 is press-fitted; and a base end portion 22d that has a cylindrical shape having a diameter smaller than the diameter of the boss portion 22c and smaller than the internal diameter of the spring member 23. The second plunger 22 has the shape axially symmetric with respect to the axis parallel to the longitudinal direction.

The spring member 23 is a conductive coil spring having a constant diameter, in which a tightly wound portion 23a is provided in its first plunger 21 side while a loosely wound portion 23b is provided in its second plunger 22 side. The end of the tightly wound portion 23a is press-fitted over the boss portion 21c, while the end of the loosely wound portion 23b is press-fitted over the boss portion 22c.

Next, the structure of the probe holder 3 will be explained with reference to FIG. 1 to FIG. 4. The probe holder 3 includes a holder portion 31 made of resin that holds the probes 2, and a frame portion 32 made of metal having a hollow portion capable of fitting therein the holder portion 31.

The holder portion 31 has a first holder member 311 and a second holder member 312 which are layered in their plate-thickness directions (vertical direction in FIG. 3). The first holder member 311 and the second holder member 312 are formed with the same number of holder holes 313 and 314 for housing the plurality of probes 2. The axis lines of the holder holes 313 and 314 for housing the same probe 2 mutually coincide with each other. The shape of the holder holes 313 and 314 is determined according to the shape of the probe 2. Positions where the holder holes 313 and 314 are formed are determined according to the wiring pattern of the semiconductor package 100, and are arranged in a substantial square in the probe holder 3. The first plunger 21 is inserted into the holder hole 313, while the second plunger 22 is inserted into the holder hole 314 in a state where the probes 2 are housed in the probe holder 3.

Each of the holder holes 313 and 314 is formed in a stepped hole shape that has different diameters along its extending direction. More specifically, the holder hole 313 is formed with a small diameter portion 313a having an opening on an upper surface of the probe holder 3 in FIG. 4 and a large diameter portion 313b whose diameter is larger than the small diameter portion 313a. Meanwhile, the holder hole 314 is formed with a small diameter portion 314a having an opening on a lower surface of the probe holder 3 in FIG. 4 and a large diameter portion 314b whose diameter is larger than the small diameter portion 314a.

Provided in mutually opposed surfaces of the first holder member 311 and the second holder member 312 are grooves 311a and 312a formed in a concave shape, respectively. The groove 311a is communicated with all the holder holes 313, while the groove 312a is communicated with all the holder holes 314. The grooves 311a and 312a are stacked to form a flow passage 31a for allowing gas to flow between the inside and the outside of the holder portion 31. Provided at the center portion of the first holder member 311 are a plurality of outlets 31b that penetrate in the plate-thickness direction and are communicated with the groove portion 311a.

The holder portion 31 structured as described above is formed by using an insulating material that has taken antistatic properties, insulation properties, thermal expansion properties, and workability into consideration.

The frame portion 32 includes a first frame member 321 and a second frame member 322 which are layered in their plate-thickness directions (vertical direction in FIG. 3). Provided in the first frame member 321 are a hollow portion 321a capable of fitting therein the first holder member 311, two openings 321b which are located along the outer periphery of the hollow portion 321a and penetrate in the plate-thickness direction, and a groove 321c provided on the bottom of the first frame member 321 so as to connect the hollow portion 321a and the openings 321b. Provided in the second frame member 322 are a hollow portion 322a capable of fitting therein the second holder member 312, and a concave-shaped groove 322b provided on the surface of the second frame member 322 opposed to the first frame member 321. The groove 322b forms a flow passage 32a, which is communicated with the flow passage 31a of the holder portion 31, together with the opening 321b and the groove 321c of the first frame member 321. The flow passage 32a is formed in an L-shaped cross section as shown in FIG. 3.

Provided in the frame portion 32 is a screw hole 32b which penetrates in its plate-thickness direction and through which a screw member 5 that is to be secured to the base member 4 is inserted. The screw hole 32b may be a straight hole through which the screw member 5 is inserted.

The frame portion 32 structured as described above has high strength and heat resistance, and is formed by using a conductive material having a small thermal expansion coefficient. As such a conductive material, any material including at least any one of low-thermal expansion metal such as Invar material and Kovar Material™, stainless steel, semiconductor, and conductive ceramics can be adopted. The frame portion 32 has an electromagnetic-wave shielding function for preventing electromagnetic waves produced and irradiated when an electrical signal passes through the probe 2 or preventing electromagnetic waves propagating from the outside, from reaching the other probes 2. In this sense, it is more preferable that a volume resistivity of the conductive material forming the frame portion 32 be about 1 to 100 μΩ·cm.

An insulating coating may be coated on at least part of the surfaces of the frame portion 32, which is continuous with the surface of the holder portion 31 (upper and lower surfaces of the frame portion 32 in FIG. 2). The coating in this case can be also implemented by an insulating adhesive agent such as an epoxy-resin-based adhesive agent, or can be also implemented by mixing at least any one of carbon, glass particles, and fabrics into the insulating adhesive agent. As a thickness of the coating (film thickness), about 50 μm to 0.5 mm is preferable.

Next, the structure of the base member 4 will be explained below with reference to FIG. 1 to FIG. 3. The base member 4 includes a conductive substrate 41 forming a base material, an insulating coating 42 coated on part of the surface of the substrate 41, and an insulating guide member 43 for guiding the semiconductor package 100 to a position in contact with the probes 2 when the semiconductor package 100 is brought into contact with the probes 2.

Provided in the substrate 41 are a first opening 41a capable of fitting therein the probe holder 3; a second opening 41b that is communicated with the first opening 41a and penetrates the substrate 41 in the plate-thickness direction together with the first opening 41a; an inlet 41c that penetrates in the plate-thickness direction, is communicated with a flow passage (opening 321b of the first frame member 321) of the probe holder 3, and flows gas into the probe holder 3; and a screw hole 41d that penetrates in the plate-thickness direction and into which a screw to be fixed to the wiring substrate 200 is screwed. In addition, screw holes (not shown) are provided on the bottom side of the base member 4, i.e., on the side where the probe holder 3 is fixed so that the screw holes are communicated with the screw holes 32b and the screw members 5 are screwed thereinto.

The opening area of the first opening 41a is larger than the opening area of the second opening 41b. The first opening 41a, the second opening 41b, and a stepped surface 41ab between the first opening 41a and the second opening 41b are formed through cutting work. Among them, the stepped surface 41ab is cut along a boundary between the first opening 41a and the second opening 41b, and comes in contact with the upper surface of the first frame member 321 when the probe holder 3 is fitted therein. In this way, by forming the first opening 41a, the second opening 41b, and the stepped surface 41ab through the cutting work, positioning accuracy when the probe holder 3 is fitted therein can be improved.

In the case of FIG. 3, the opening area of the inlet 41c is equal to the opening area of the opening 321b, however, it is not limited thereto, and the opening area of the inlet 41c may be different from the opening area of the opening 321b.

The inlet 41c and the flow passages 31a and 32a allow gas (air) inside the probe holder 3, especially around the probe 2, to move by blast or pressure from the outside of the probe unit 1. The gas flowing into the inlet 41c and the flow passages 31a and 32a is output to the outside of the probe holder 3 via the outlets 31b. Therefore, like conductivity test of, for example, a high-frequency circuit, even if the probes 2 generate heat by flowing of a large amount of current, the air is allowed to flow thereinto from the outside of the probe unit 1 through the inlets 41c and the flow passages 31a and 32a, and this enables the probes 2 and the heat around the probes 2 to be quickly cooled down. In addition, when a high-temperature load test is to be conducted, by allowing hot air at a high-temperature to flow thereinto through the inlets 41c and the flow passages 31a and 32a, the surrounding of the probe holder 3 can be quickly changed to a high-temperature state.

The coating 42 around the edge of the opening of the inlet 41c is peeled slightly largely in size than the opening area of the inlet 41c, so that the substrate 41 of the base member 4 is exposed to the surface. With this, even if the end portion a gas flow-in member for letting gas in is in contact with the inlet 41c and is applied with pressure, the inlet 41c does not deformed due to influence such as the temperature of the gas. Therefore, all the gas can be reliably let into the probe unit 1.

Provided on the upper surface of the substrate 41 are positioning pins 6 for positioning a member to be mounted on the substrate 41 from above the substrate 41. When a positioning pin 6 is provided on the upper surface of the substrate 41, a hole is made on the upper surface of the substrate 41 in order to knock therein a rod member having a larger diameter than that of the positioning pin 6, and the rod member is knocked in the hole so as to be secured. Thereafter, by subjecting the secured rod member to a post-process such as cutting work, the position and the diameter of the positioning pin 6 are adjusted. This post-process cannot be implemented when a resin substrate is t applied in view of the strength. Therefore, when the positioning pin is provided on the resin substrate, it is necessary to control each accuracy of the pin diameter, the hole diameter, and the position of the hole at the manufacturing stage of the components. On the other hand, because the substrate 41 is formed of a conductive material such as metal, the post-process can be applied to the substrate 41, so that the positioning pins 6 can be arranged on predetermined positions of the substrate 41 with high accuracy without controlling the accuracy of the pin diameter, the hole diameter, and the position of the hole at the manufacturing stage of the components.

The substrate 41 structured as described above is implemented by using the same conductive material as that of the frame portion 32 of the probe holder 3.

The coating 42 covers the surface of the substrate 41 except for the edge of the first opening 41a, the stepped surface 41ab, and an area around the opening edge of the inlet 41c. The material and the thickness (film thickness) of the coating 42 are the same as the material and the thickness of the coating to cover the surface of the frame portion 32. That is, the coating 42 is obtained by an insulating adhesive agent or the like, and its thickness is preferably about 50 μm to 0.5 mm.

The guide member 43 has a third opening 43a that can house therein the semiconductor package 100. The third opening 43a is structured to have the opening area that is made gradually smaller toward the inside thereof from an opening surface that faces the outside and then have a fixed opening area. Because the guide member 43 may contact the semiconductor package 100, the material of the guide member 43 is preferably any material having insulation properties higher than the insulating material forming the coating 42 and having antistatic properties higher than the insulating material forming the coating 42, and the guide member 43 is implemented by using, for example, PES or PEEK.

In the probe unit 1 structured as described above, because the screw hole portions of the probe holder 3 and the base member 4 are high-strength metal, the probe holder 3 and the base member 4 can be strongly fixed to each other.

According to the embodiment of the present invention explained above, it has the conductive substrate 41 that includes the first opening 41a capable of fitting therein the probe holder 3, and the second opening 41b whose bottom is located on the same plane as that of the first opening 41a and which is communicated with the first opening 41a in such a manner that a portion overlapping the bottom of the first opening 41a is open; the insulating coating 42 made of the insulating adhesive agent and coated at least on the edge of the second opening 41b; and the insulating guide member 43 bonded to the edge of the second opening 41b through the coating 42 to guide the semiconductor package 100 to the position in contact with the probe 2. Therefore, the thickness for insertion of the screw does not have to be secured in the guide member 43, and the thickness of the portion of the substrate 41 to which the guide member 43 is bonded can be made thicker accordingly, thus improving the rigidity of the base member 4. Moreover, there is no need to screw the guide member 43 to the substrate 41, thus reducing the troublesome operations upon its manufacture.

According to the present embodiment, because the guide member 43 is integrated as part of the base member 4, the number of components such as a screw and a positioning pin can be reduced, and assemble processes can also be reduced. Therefore, the cost required for manufacture can be reduced.

According to the present embodiment, there is no need to consider the position of the screw to joint the substrate 41 and the guide member 43, thus improving the freedom of layout design.

According to the present embodiment, because the inlet 41c of the base member 4 is formed of the conductive material with high strength, even if the end portion the gas flow-in member for letting the gas in the probe unit 1 from the outside is brought into contact with the inlet 41c to apply pressure thereto, the inlet 41c does not deformed thereby. Therefore, all the gas can be reliably flowed into the probe unit 1 from the gas flow-in member.

The exemplary embodiment to implement the present invention has been explained so far, however, the present invention is not limited only by the one embodiment. For example, in the present invention, it is possible acceptable that an inlet of the base member and a flow passage of the probe holder are not provided. In this manner, the present invention can include various embodiments which are not described herein, and various designs or the like can be changed within a scope not departing from the technical idea specified by the appended claims.

INDUSTRIAL APPLICABILITY

The probe-unit base member and the probe unit according to the present invention are appropriate for conducting an electrical characteristic test of a predetermined circuit configuration of the semiconductor package or the like.

REFERENCE SIGNS LIST

1 PROBE UNIT
2 PROBE
3 PROBE HOLDER
4 PROBE-UNIT BASE MEMBER
5 SCREW MEMBER
6 POSITIONING PIN
21 FIRST PLUNGER
21a, 22a END PORTION
21b, 22b FLANGE PORTION
21c, 22c BOSS PORTION
21d, 22d BASE END PORTION
22 SECOND PLUNGER
23 SPRING MEMBER
23a TIGHTLY WOUND PORTION
23b LOOSELY WOUND PORTION
31 HOLDER PORTION
31a, 32a FLOW PASSAGE
31b OUTLET
32 FRAME PORTION
41 SUBSTRATE
41a FIRST OPENING
41ab STEPPED SURFACE
41b SECOND OPENING
41c INLET
42 COATING
43 GUIDE MEMBER
43a THIRD OPENING
100 SEMICONDUCTOR PACKAGE
101, 201 ELECTRODE
200 WIRING SUBSTRATE

311 FIRST HOLDER MEMBER
311a, 311b GROOVE
312 SECOND HOLDER MEMBER
313, 314 HOLDER HOLE
313a, 314a SMALL DIAMETER PORTION
313b, 314b LARGE DIAMETER PORTION
321 FIRST FRAME MEMBER
321a, 322a HOLLOW PORTION
321b OPENING
321c, 322b GROOVE
322 SECOND FRAME MEMBER

The invention claimed is:

1. A probe-unit base member provided in a probe unit, which includes a conductive probe having both ends respectively brought into contact with two different contact bodies and a probe holder for housing a plurality of the probes arranged in a predetermined pattern while the both ends of each of the probes are exposed, the probe-unit base member securing and holding the probe holder, the probe-unit base member comprising:
   a conductive substrate that has a first opening capable of fitting therein the probe holder and a second opening communicated with the first opening;
   a coating that is made of a material including an insulating adhesive agent and is coated at least on an edge of the second opening; and
   an insulating guide member that is bonded to the edge of the second opening through the coating and guides one of the two contact bodies to a position in contact with the probes.

2. The probe-unit base member according to claim 1, wherein the guide member is made of a material having an antistatic property higher than that of the insulating adhesive agent.

3. The probe-unit base member according to claim 1, wherein
   an opening area of the first opening is larger than that of the second opening, and
   a stepped surface between the first opening and the second opening is cut along a boundary between the first opening and the second opening.

4. The probe-unit base member according to claim 3, wherein the substrate is exposed on the stepped surface.

5. A probe unit comprising:
   a conductive probe having both ends respectively brought into contact with two different contact bodies;
   a probe holder for housing a plurality of the probes arranged in a predetermined pattern while the both ends of each of the probes are exposed; and
   a probe-unit base member that includes
      a conductive substrate that has a first opening capable of fitting therein the probe holder and a second opening communicated with the first opening,
      a coating that is made of a material including an insulating adhesive agent and is coated at least on an edge of the second opening, and
      an insulating guide member that is bonded to the edge of the second opening through the coating and guides one of the two contact bodies to a position in contact with the probes,
   wherein the probe-unit base member secures and holds the probe holder.

6. The probe unit according to claim 5, wherein
   the probe-unit base member includes an inlet for flowing air therein from outside of the probe-unit base member, and
   the probe holder includes a flow passage that is communicated with the inlet and allows the air flowed therein through the inlet to flow.

7. The probe unit according to claim 5, wherein the probe holder includes
   a holder portion that is made of an insulating material and holds the probes; and
   a frame portion that is made of a conductive material and includes a hollow portion capable of fitting therein the holder portion.

* * * * *